(12) United States Patent
Simin et al.

(10) Patent No.: US 10,593,839 B2
(45) Date of Patent: Mar. 17, 2020

(54) SOLID-STATE LIGHT SOURCE WITH SMALL AREA CONTACT

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Silver Spring, MD (US)

(73) Assignee: Sensor Electronic Technology, Inc., Columbia, SC (US)

( * ) Notice: Subject to any disclaimer, the term of this patent is extended or adjusted under 35 U.S.C. 154(b) by 14 days.

(21) Appl. No.: 15/798,875

(22) Filed: Oct. 31, 2017

(65) Prior Publication Data

US 2019/0027651 A1 Jan. 24, 2019

Related U.S. Application Data

(60) Provisional application No. 62/415,474, filed on Oct. 31, 2016.

(51) Int. Cl.
| | |
|---|---|
| *H01L 33/38* | (2010.01) |
| *H01L 33/06* | (2010.01) |
| *H01L 33/40* | (2010.01) |
| *H01L 33/30* | (2010.01) |
| *H01L 33/32* | (2010.01) |
| *H01L 33/46* | (2010.01) |

(52) U.S. Cl.
CPC ............ *H01L 33/382* (2013.01); *H01L 33/06* (2013.01); *H01L 33/30* (2013.01); *H01L 33/32* (2013.01); *H01L 33/38* (2013.01); *H01L 33/405* (2013.01); *H01L 33/387* (2013.01); *H01L 33/46* (2013.01)

(58) Field of Classification Search
CPC ....... H01L 33/382; H01L 33/38; H01L 33/32; H01L 33/30; H01L 33/06; H01L 33/405; H01L 33/46; H01L 33/387; H01L 33/0004–648
See application file for complete search history.

(56) References Cited

U.S. PATENT DOCUMENTS

| | | |
|---|---|---|
| 8,969,198 B2 | 3/2015 | Gaevski et al. |
| 9,312,448 B2 | 4/2016 | Lunev et al. |

(Continued)

OTHER PUBLICATIONS

Nishiyama, H., et al., "Form and Capacitance of Parallel-Plate Capacitors," IEEE Transactions on Components, Packaging, and Manufacturing Technology, V17, Sep. 1994, 8 pages.

(Continued)

*Primary Examiner* — Cuong B Nguyen
(74) *Attorney, Agent, or Firm* — LaBatt, LLC

(57) ABSTRACT

A contact for solid state light sources is described. The solid state light source can include an active region, such as a light emitting multiple quantum well, and a semiconductor layer, such as a p-type layer, from which carriers (e.g., holes) enter the active region. A contact can be located adjacent to the semiconductor layer and include a plurality of small area contacts extending only partially through the semiconductor layer. The plurality of small area contacts can have a characteristic lateral size at an interface between the small area contact and the semiconductor layer equal to or smaller than a characteristic depletion region width for the plurality of small area contacts.

20 Claims, 10 Drawing Sheets

(56) References Cited

U.S. PATENT DOCUMENTS 9,660,043 B2     5/2017    Gaevski et al.
9,793,439 B2    10/2017    Lunev et al.
2015/0091043 A1*    4/2015    Shur .................... H01L 33/382
                                                                                               257/99

OTHER PUBLICATIONS

Zhang, Y., et al., "Interband tunneling for hole injection in III-nitride ultraviolet emitters," Applied Physics Letters 106, 2015, 6 pages.
Zhang, Z., et al. "A charge inverter for III-nitride light-emitting diodes," Applied Physics Letters 108, 2016, 6 pages.
Zhang, Z., et al., "A hole accelerator for InGaN/GaN light-emitting diodes," Applied Physics Letters 105, 2014, 6 pages.

* cited by examiner

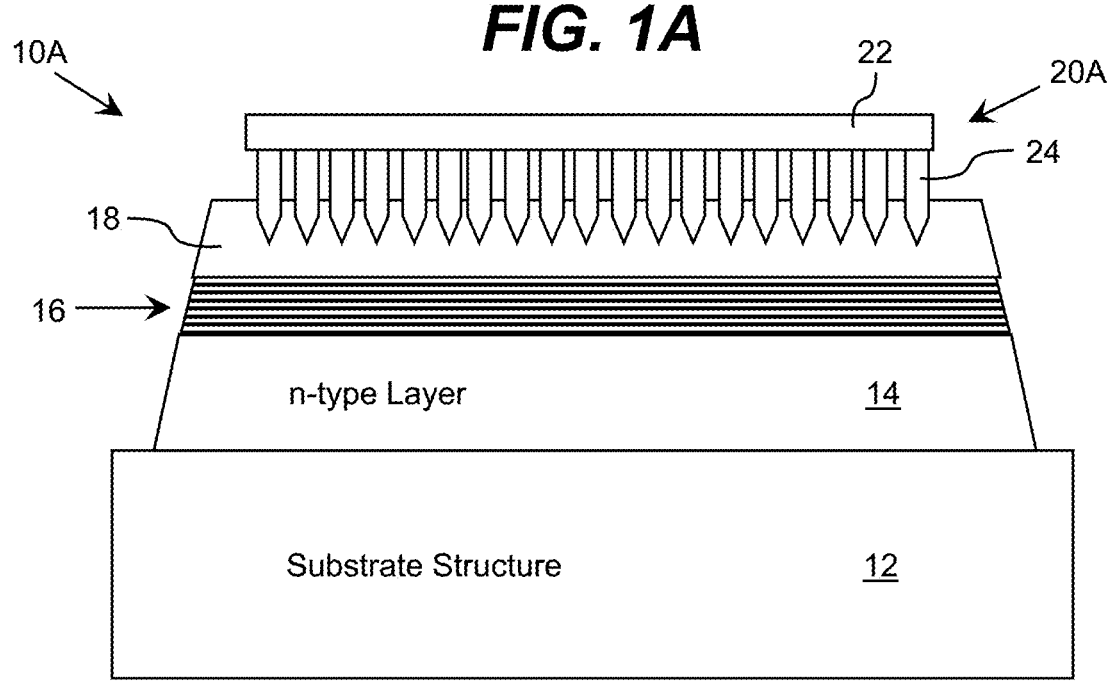
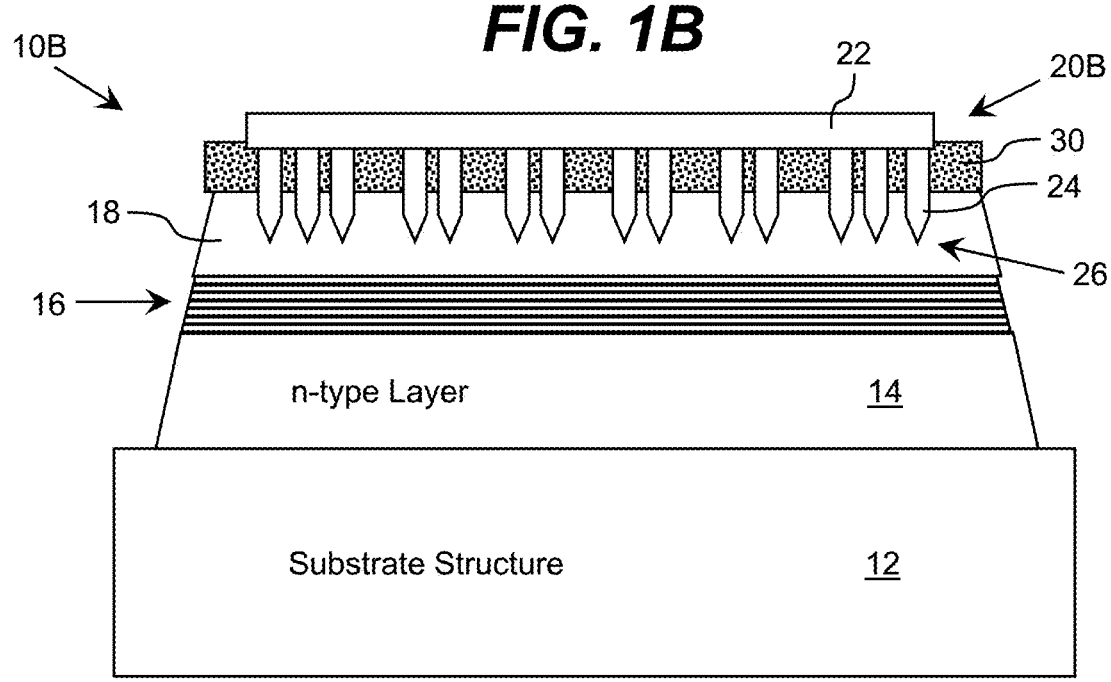

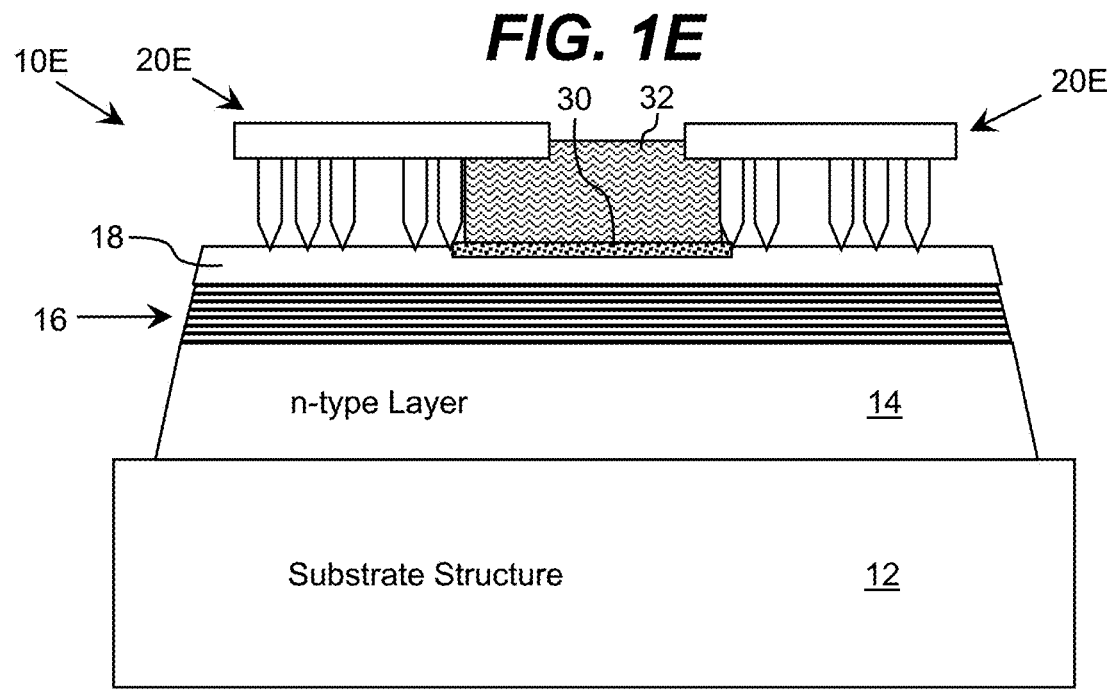
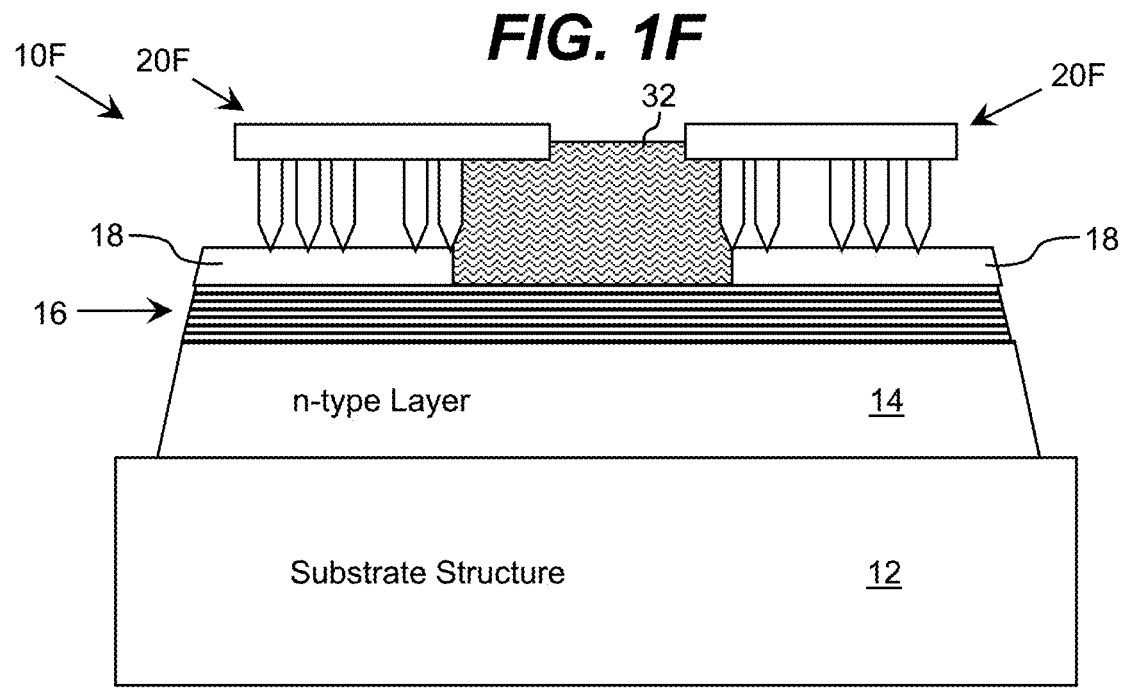

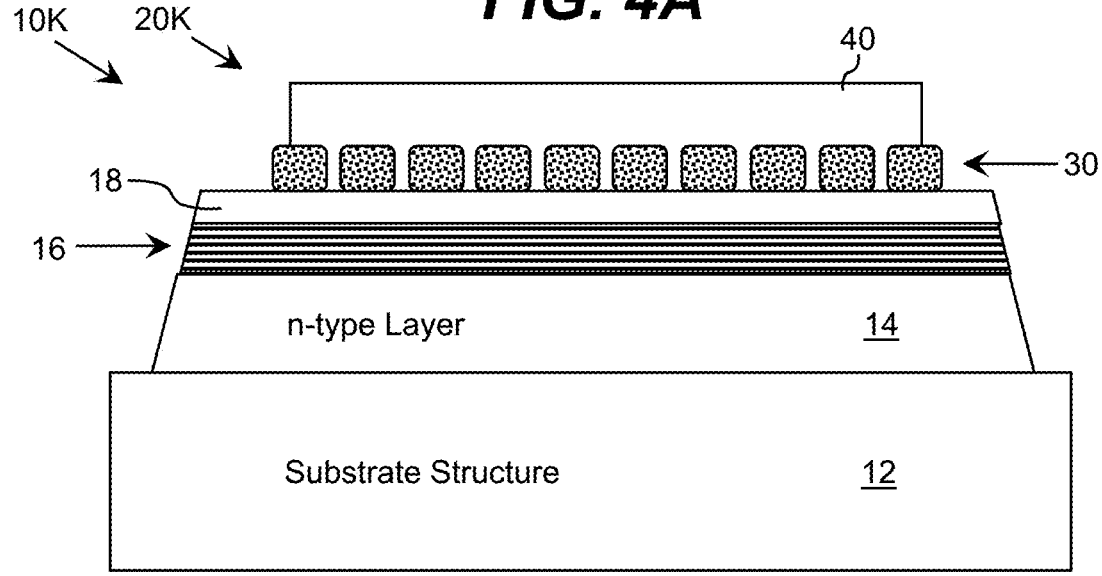
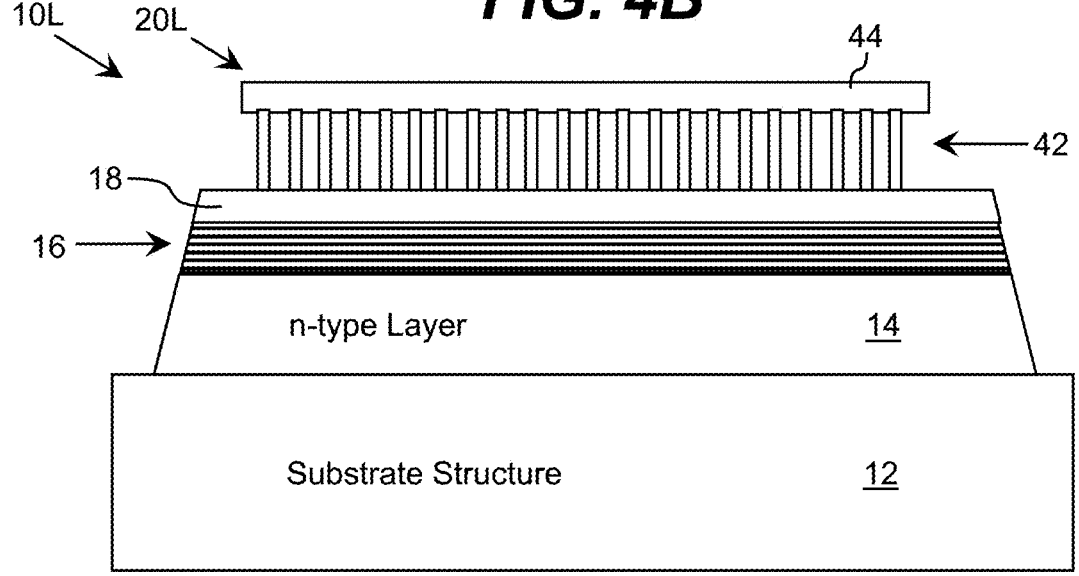

SOLID-STATE LIGHT SOURCE WITH SMALL AREA CONTACT

REFERENCE TO RELATED APPLICATIONS

The current application claims the benefit of U.S. Provisional Application No. 62/415,474, filed on 31 Oct. 2016, which is hereby incorporated by reference.

TECHNICAL FIELD

The disclosure relates generally to solid state light sources, and more particularly, to an improved contact for a solid state light source.

BACKGROUND ART

A great deal of interest has been focused on solid state light sources (SSLSs), such as light emitting diodes (LEDs) and lasers, in particular those that emit light in the blue and deep ultraviolet (UV) wavelengths. These devices may be capable of being incorporated into various applications, including solid-state lighting, biochemical detection, high-density data storage, and the like. UV LEDs are mainly fabricated using group III nitride heterostructures. In these materials, achieving a high level of p-type doping required for efficient LED operation presents a significant problem due to high ionization energy of acceptor impurities.

Prior approaches have proposed various designs for LEDs. In one approach, the proposed structure includes an additional $SiO_2$/semiconductor interface at which a hole accumulation layer is formed. The holes need to tunnel through the dielectric to reach the LED active region. Although the hole accumulation layer in this design may help increase the hole concentration significantly, the concentration of holes tunneling through the dielectric is significantly lower than that in the accumulation layer. Secondly, adding the dielectric layer substantially increases the turn-on voltage of the device.

In another approach, an LED design includes a tunnel junction formed between n- and p-AlGaN layers. In this design, a high electron concentration in the top AlGaN layer causes carrier tunneling through the junction and reduces the lateral spreading resistance. However, this design does not allow for significant improvement in the hole injection into the LED active region. In still another approach, an LED design includes a hole acceleration layer. In particular, the LED contains an additional p-GaN layer and p-AlGaN barrier forming a region with a strong electric field enhancing the hole emission over the barrier. This approach is limited by an excessive voltage drop across the additional barrier and an insignificant increase in the hole injection into the LED active region.

SUMMARY OF THE INVENTION

Aspects of the invention provide a contact for solid state light sources. The solid state light source can include an active region, such as a light emitting multiple quantum well, and a semiconductor layer, such as a p-type layer, from which carriers (e.g., holes) enter the active region. A contact can be located adjacent to the semiconductor layer and include a plurality of small area contacts extending only partially through the semiconductor layer. The plurality of small area contacts can have a characteristic lateral size at an interface between the small area contact and the semiconductor layer equal to or smaller than a characteristic depletion region width for the plurality of small area contacts.

A first aspect of the invention provides a solid state light source comprising: an active region; a contact for injecting holes into the active region; and a p-type layer located between the active region and the contact, wherein the contact includes: a plurality of small area contacts extending only partially through the p-type layer; and a set of electrodes physically connecting the plurality of small area contacts, wherein the plurality of small area contacts have a characteristic lateral size at an interface between the small area contact and the p-type layer equal to or smaller than a characteristic depletion region width for the plurality of small area contacts.

A second aspect of the invention provides a solid state light source comprising: an active region; a contact; and a semiconductor layer located between the active region and the contact, wherein the contact includes a plurality of small area contacts extending only partially through the semiconductor layer, wherein the plurality of small area contacts have a characteristic lateral size at an interface between the small area contact and the semiconductor layer equal to or smaller than a characteristic depletion region width for the plurality of small area contacts, and wherein the characteristic lateral size is less than 0.1 microns.

A third aspect of the invention provides a solid state light source comprising: a light emitting multiple quantum well active region having a p-type side and an n-type side; a p-type contact; and a p-type semiconductor layer located between the active region and the contact on the p-type side, wherein the p-type contact includes: a plurality of small area contacts extending only partially through the semiconductor layer, wherein the plurality of small area contacts have a characteristic lateral size at an interface between the small area contact and the semiconductor layer equal to or smaller than a characteristic depletion region width for the plurality of small area contacts, and wherein the characteristic lateral size is less than 0.1 microns; and a set of electrodes physically connecting the plurality of small area contacts.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A-1G show various illustrative schematics of device heterostructures according to embodiments.

FIGS. 4A-4C show several illustrative schematics of device heterostructures showing different approaches for forming small area contacts according to embodiments.

FIG. 5A shows a microscopic image of a top surface of an anodized aluminum oxide layer, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1C:
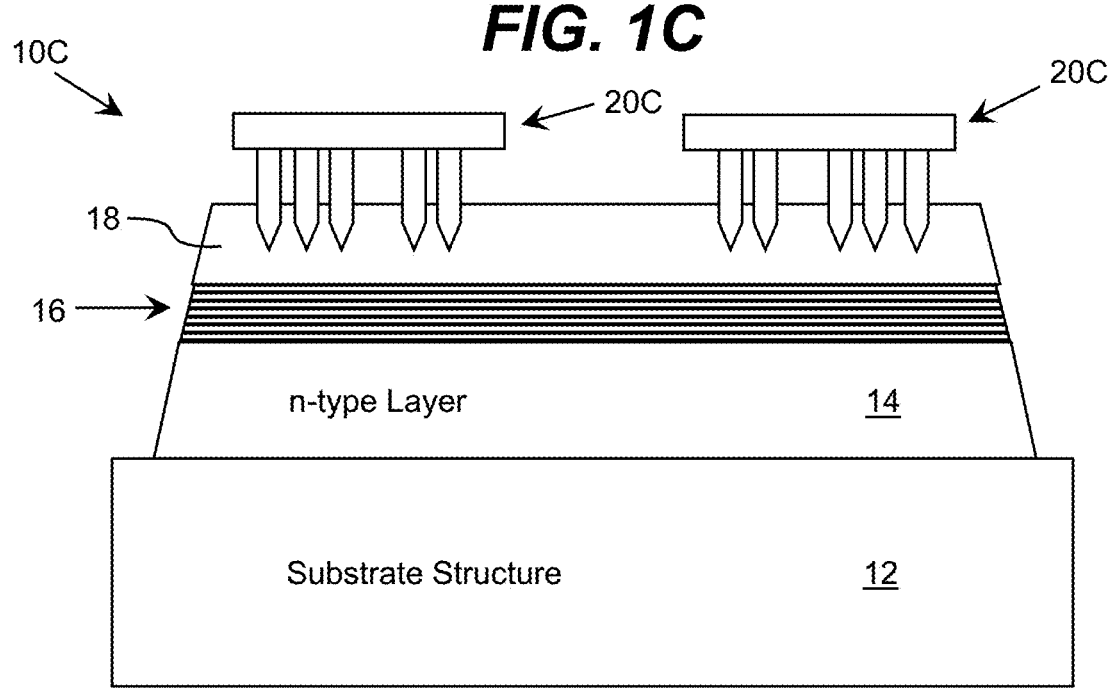

As indicated above, aspects of the invention provide a contact for solid state light sources. The solid state light source can include an active region, such as a light emitting multiple quantum well, and a semiconductor layer, such as a p-type layer, from which carriers (e.g., holes) enter the active region. A contact can be located adjacent to the semiconductor layer and include a plurality of small area contacts extending only partially through the semiconductor layer. The plurality of small area contacts can have a characteristic lateral size at an interface between the small area contact and the semiconductor layer equal to or smaller than a characteristic depletion region width for the plurality of small area contacts.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. A value, y, is on the order of a stated value, x, when the value y satisfies the formula $0.1x \leq y \leq 10x$. As used herein, a "characteristic size" and related terms of an object corresponds to a measurement of the physical size of the object that defines its influence on a system.

As used herein, an SSLS includes any type of semiconductor light source, such as a light emitting diode (LED) that, under normal operating conditions, operates in a forward-bias mode. The SSLS can include of a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, light emitting solid state lasers, laser diodes of various types, and/or the like. These examples of SSLSs can be configured to emit electromagnetic radiation from a light generating structure such as an active region upon application of a bias. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the SSLSs can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the SSLS (e.g., peak emission wavelength+/− five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the SSLS can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

Aspects of the invention are shown and described in conjunction with devices fabricated using group III nitride materials, in which some or all of the various layers are formed of elements selected from the group III nitride materials system. Group III nitride materials comprise one or more group III elements (e.g., boron (B), aluminum (Al), gallium (Ga), and indium (In)) and nitrogen (N), such that $B_wAl_xGa_yIn_zN$, where $0 \leq W, X, Y, Z \leq 1$, and $W+X+Y+Z=1$. Illustrative group III nitride materials can include binary, ternary and quaternary alloys such as, AlN, GaN, InN, GaAs, GaInAs, GaInP, BN, AlGaN, AlInGaN, AlInN, AlBN, AlGaInN, AlGaBN, AlInBN, and AlGaInBN with any molar fraction of group III elements. However, it is understood that aspects of the invention can be implemented in conjunction with devices fabricated from other types of materials, such as other group III-V materials.

Turning to the drawings, FIGS. 1A-1G show various illustrative schematics of device heterostructures according to embodiments. In each case, the device 10A-10G is shown including a substrate structure 12, an n-type layer 14 (e.g., a cladding layer, electron supply layer, contact layer, and/or the like) located adjacent to the substrate structure 12, an active region 16 located adjacent to the n-type layer 14, and a p-type layer 18 (e.g., an electron blocking layer, a cladding layer, hole supply layer, and/or the like) located adjacent to the active region 16.

It is understood that this configuration of layers is only illustrative of various heterostructures which can be utilized in embodiments described herein. To this extent, embodiments of a heterostructure described herein may include one or more additional layers and/or not include one or more of the layers illustrated. For example, an embodiment of a device can be implemented without the substrate structure 12, which can be, for example, removed after fabrication of the remainder of the heterostructure. Additionally, while each embodiment is shown as including the n-type layer located between the substrate structure 12 and the active region 16, it is understood that embodiments in which the p-type layer 18 is located between the substrate structure 12 and the active region 16 and the n-type layer 14 is located on the opposing side of the active region 16 are possible.

An embodiment of the substrate structure 12 includes a substrate with a buffer layer grown thereon. In one embodiment, the substrate can include sapphire, silicon carbide (SiC), silicon (Si), GaN, GaAs, AlGaN, AlON, LiGaO$_2$, InP, AlN, AIII-BV or AIIBVI compounds, SiO$_2$, Si$_3$N$_4$, diamond or other suitable material, and the buffer layer can include AlN, an AlGaN/AlN superlattice, and/or the like. In one embodiment, the substrate can include a non-conductive or insulating (e.g., dielectric) substrate. Examples of a non-conductive or insulating substrate can include highly-resistive silicon, insulating SiC, sapphire, diamond, a dielectric material, organic materials, and/or the like. In an embodiment, the substrate comprises a metal layer. In this case, the substrate and an electrode 22 described herein can form a Fabry-Perot resonator. In an embodiment, the buffer layer can comprise a group III nitride material, such as aluminum nitride, on which the remaining group III nitride layers of the device 10A-10G can be grown using an epitaxial growth process and/or the like.

An illustrative embodiment of a group III nitride based device 10A-10G includes an active region 16 formed by a multiple quantum well (MQW) region including a series of alternating quantum wells and barriers. In this case, electrons are injected into the active region 16 from the n-type layer 14, while holes are injected from the p-type layer 18. The active region 16 can be composed of In$_y$Al$_x$Ga$_{1-x-y}$N, Ga$_z$In$_y$Al$_x$B$_{1-x-y-z}$N, an Al$_x$Ga$_{1-x}$N semiconductor alloy, or the like. Similarly, the n-type layer 14 and the p-type layer 18 can be composed of an In$_y$Al$_x$Ga$_{1-x-y}$N alloy, a Ga$_z$In$_y$Al$_x$B$_{1-x-y-z}$N alloy, or the like. The molar fractions given by x, y, and z can vary between the various layers 14, 16, and 18. In an illustrative embodiment, the p-type layer 18 is AlGaN.

Holes are injected into the p-type layer 18 from a p-type contact 20A-20G. Each p-type contact 20A-20G is shown including a plurality of small area (point) contacts 24, each of which forms a metal-semiconductor contact interface with the p-type layer 18. In an embodiment, the p-type contacts 20A-20G are formed of a metal, such as nickel. In another embodiment, each p-type contact 20A-20G can comprise a multilayer metallic structure in which the metal contacting the p-type layer 18 is nickel. As described herein, the plurality of small area contacts 24 can have a lateral size and spacing that are configured to improve the injection of holes into the active region 16. In an embodiment, the small area contacts 24 have an elliptical (e.g., circular) cross-section along a plane corresponding to the intersection of the small area contacts 24 with the p-type layer 18. In another embodiment, the small area contacts 24 can comprise stripes, with one lateral dimension being small, while the other lateral dimension can be much larger, e.g., extend along the lateral length of the device.

Additionally, the p-type contacts 20A-20G can include an electrode 22, which physically and electrically connects the small area contacts 24 of each p-type contact 20A-20G. The electrode 22 can comprise a thin layer of gold in the proximity of the p-type contact 20A-20G followed by a conductive metal, such as copper. In an embodiment the electrode 22 comprises a gold plated metal, such as copper. In an embodiment, the electrode 22 can be perforated, e.g., to reduce absorption of the ultraviolet radiation. In an embodiment, the electrode 22 can be transparent to the electromagnetic radiation generated by the active region 16. For example, the electrode 22 can comprise a short period superlattice lattice structure, such as a transparent magnesium (Mg)-doped AlGaN/AlGaN short period superlattice structure (SPSL).

The small area contacts 24 are shown extending partially into the p-type layer 18. Each small area contact 24 can comprise a sharp protrusion. As shown in conjunction with the device 10A, the small area contacts 24 can have an arrangement that is laterally uniform. In an embodiment, the average spacing between the small area contacts 24 (as measured by the distance between adjacent edges of adjacent small area contacts) is in a range between 100 nanometers to a few microns (e.g., 2-5 microns). As illustrated in conjunction with the device 10B, the small area contacts 24 can have an arrangement that is laterally non-uniform. For example, the small area contacts 24 can be located in clusters 26, where each cluster 26 includes multiple small area contacts 24 separated by a first spacing, and each cluster 26 is separated from another cluster by a second spacing that is larger than the first spacing. In an embodiment, the contacts 24 can be separated by distances on the order of 100 nm, whereas clusters 26 can be separated by a distance on the order of few microns (e.g., 2-5 microns).

The small area contacts 24 can be separated from each other and the electrode 22 can be separated from the p-type layer 18 by an air gap, as shown in FIG. 1A, or by an insulating layer 30 as shown in FIG. 1B. The insulating layer 30 can be formed of any type of insulating material such as, for example, silicon dioxide (SiO$_2$), silicon nitride (Si$_3$N$_4$), aluminum oxide (Al$_2$O$_3$), other dielectric materials, and/or the like.

A device described herein can include more than one p-type contact. For example, FIG. 1C shows an illustrative device 10C including a pair of p-type contacts 20C, each of which has a corresponding cluster of small area contacts and an electrode as described herein. The p-type contacts 20C are not physically connected to each other. In this case, the device 10C can be implemented in a circuit in which each p-type contact 20C is connected to its own bias, which may be the same or differ.

Figure 2:
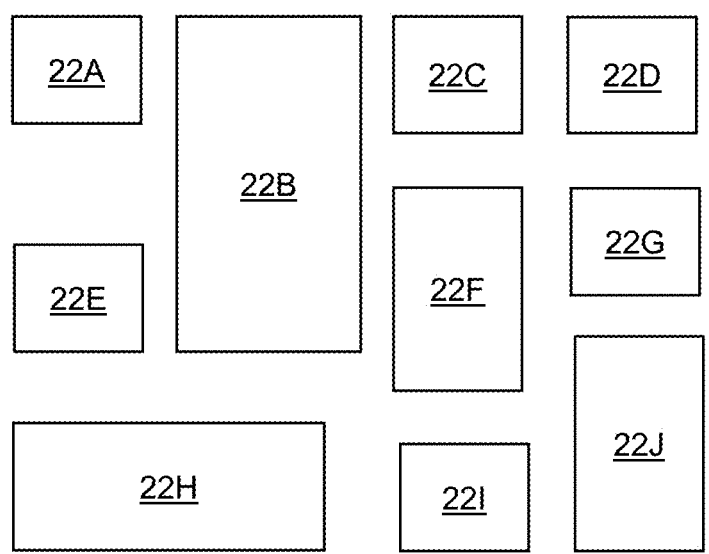
FIG. 2 shows a top view of an illustrative arrangement of electrodes according to an embodiment.

In an embodiment, the p-type contacts 20C can have different sizes and/or shapes and/or be arranged in a two-dimensional pattern on a device 10C. For example, FIG. 2 shows a top view of an illustrative arrangement of electrodes 22A-22J according to an embodiment. As illustrated, the electrodes 22A-22J can include various sizes. Each electrode 22A-22J can include a corresponding cluster of small area contacts as described herein. While each electrode 22A-22J is shown as having a rectangular shape, it is understood that this is only illustrative, and an electrode can have any shape, including an irregular shape.

Figure 1D:
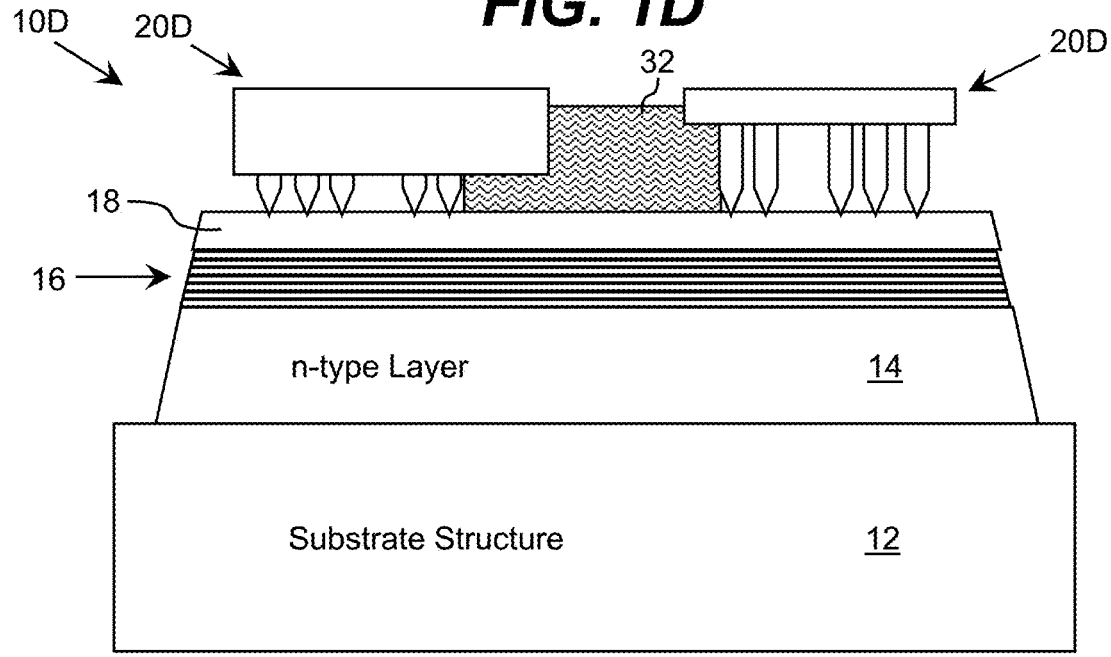

An embodiment of the device can be utilized to evaluate a physical matter (e.g., a solid or a fluid) under test. For example, as illustrated in FIG. 1D, a test substance 32 can be deposited in an opening between two p-type contacts 20D, each of which includes a cluster of small area contacts and an electrode as described herein. While not shown for clarity, it is understood that the opening between two p-type contacts 20D can be insulated from the surfaces of the electrodes, e.g., for cases when the material being tested can be a corrosive or conductive media. The presence of the test substance 32 will affect the overall performance of the device 10D. Such influence can be measured and evaluated to determine one or more properties of the test substance 32. For instance, an illustrative property of the test substance 32 that can be inferred is its absorbance of UV radiation and/or reflectance/transmittance of the substance to UV radiation. The test substance 32 can be encapsulated in order to be attached to the openings within electrodes. In another embodiment, the test substance 32 can be positioned and secured in place by force of gravity, e.g., for a device oriented to emit down.

In the device 10E shown in FIG. 1E, an insulating layer 30 is shown located on a top surface of the p-type layer 18 in the opening between the two p-type contacts 20E. In this configuration, the insulating layer 30 can prevent the test substance 32 from interacting with the p-type semiconductor layer 18.

Figure 1G:
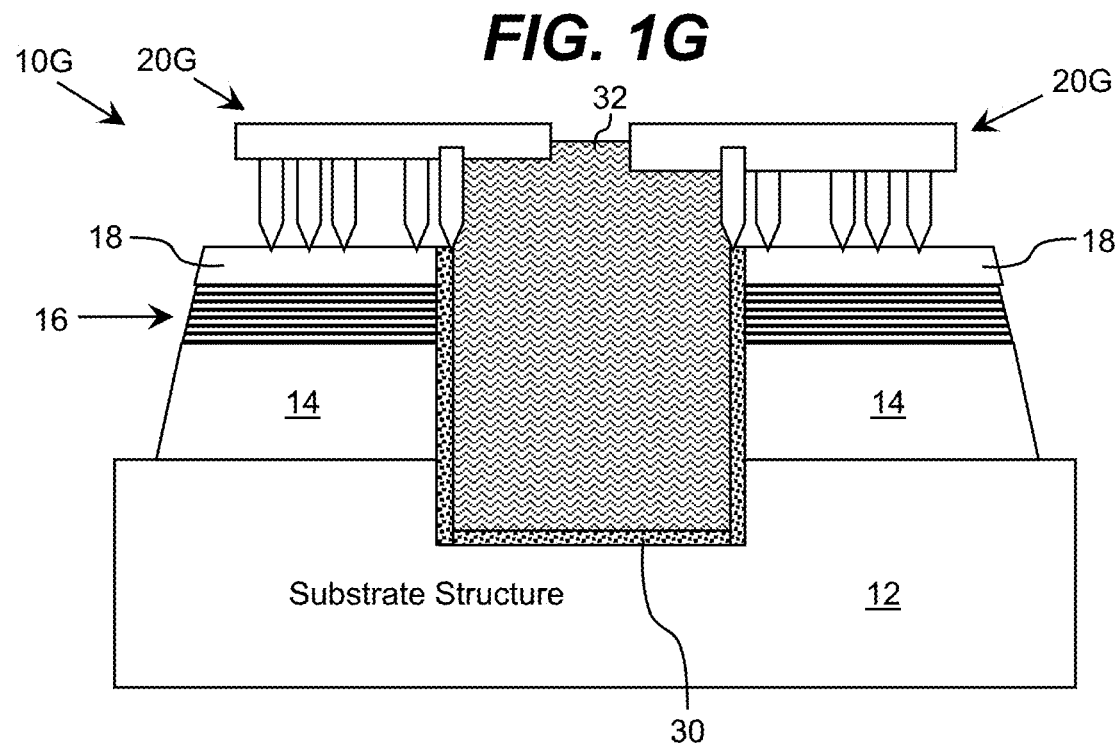

One or more of the layers of the heterostructure can be partially or completely etched, e.g., to form a channel for a test substance 32. For example, in the device 10E, the p-type layer 18 can be partially etched prior to depositing the insulating layer 30 on the surface. As illustrated in FIG. 1F, the p-type layer 18 can be completely etched to form a channel for the test substance 32 in which the test substance 32 directly contacts the active region 16. In FIG. 1G, the device 10F includes a channel for the test substance 32 that extends through the layers 14, 16, 18, and partially into the substrate structure 12. As illustrated, the channel can include an insulating layer 30 formed of a dielectric material to insulate the test substance 32 from the semiconductor layers 14, 16, 18.

While not shown for clarity, it is understood that each of the devices 10A-10G includes an n-type contact to the n-type layer 14. The n-type contact can have any of various configurations. For example, the n-type contact can be formed on a surface of the n-type layer 14, which extends beyond the active region 16 and p-type layer 18. Additionally, the n-type contact can directly contact one or more side surfaces of the n-type layer 14. In an embodiment, the n-type contact includes a plurality of small area contacts that extend into the n-type layer 14 and are connected by a corresponding electrode as shown and described herein.

Figure 3A:
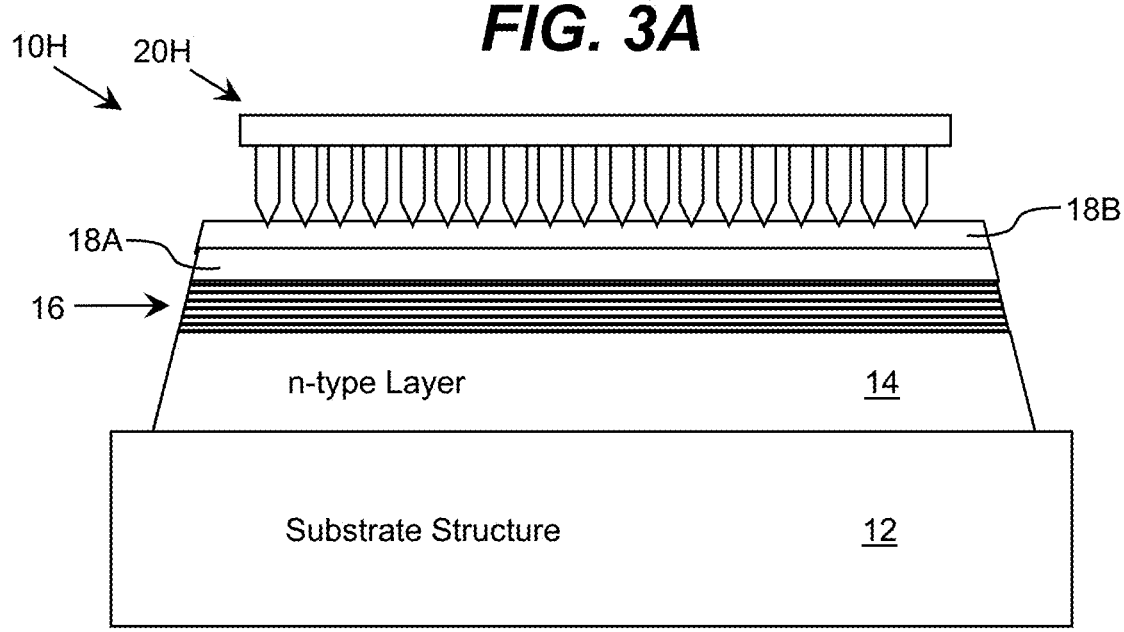
FIGS. 3A and 3B show illustrative schematics of device heterostructures according to other embodiments.
Figure 3B:
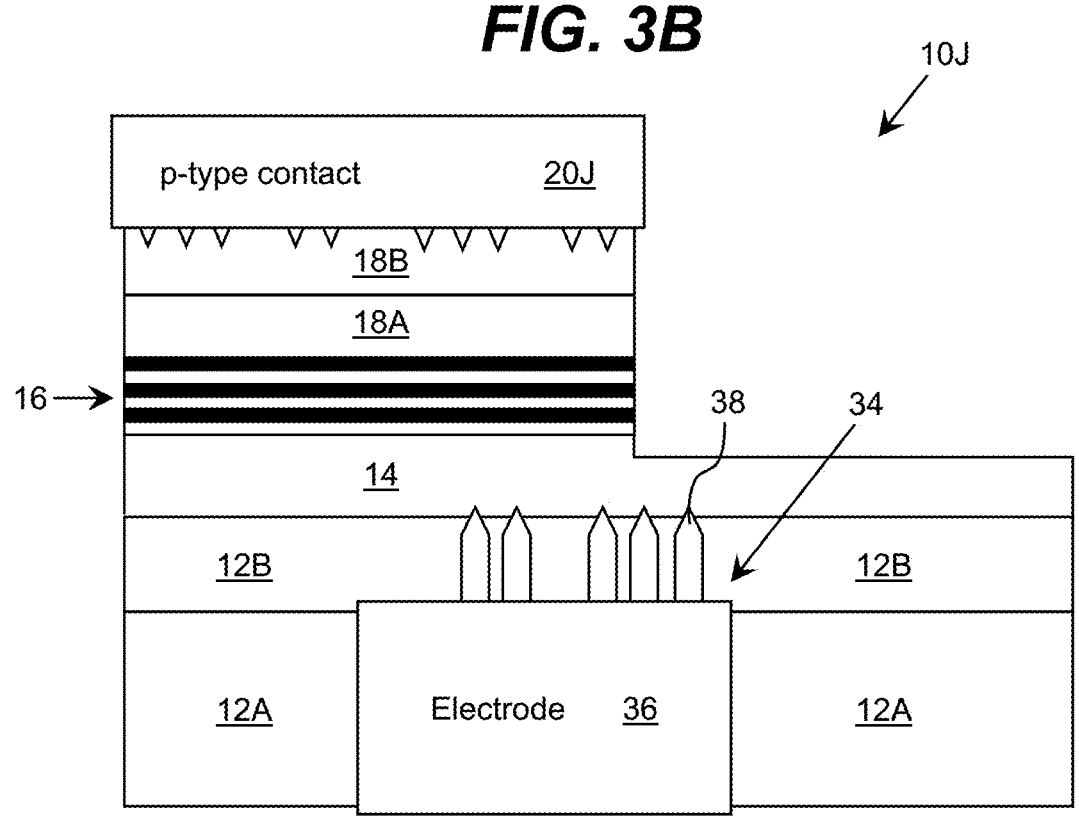

FIGS. 3A and 3B show illustrative schematics of device heterostructures according to other embodiments. In FIG. 3A, the device 10H is shown including a first p-type layer 18A (e.g., an electron blocking layer, a cladding layer, hole supply layer, and/or the like) and a second p-type layer 18B (e.g., a cladding layer, hole supply layer, contact layer, and/or the like) located on the active region 16 and a p-type contact 20H including a plurality of small area contacts and an electrode configured as described herein located thereon. In an embodiment, the second p-type layer 18B is formed of a material having a smaller bandgap than the first p-type layer 18A to facilitate hole injection. For example, for a group III nitride device, the first p-type layer can be AlGaN, while the second p-type layer 18B is GaN. As illustrated, the small area contacts can partially penetrate the second p-type layer 18B. Including the second p-type layer 18B configured in this manner, higher acceptor doping levels can be achieved and therefore more efficient hole injection can be obtained through the small area contacts of the p-type contact 20H.

In FIG. 3B, the device 10J is shown including a substrate structure which includes a substrate 12A and a buffer layer 12B. An n-type layer 14 is formed on the buffer layer 12B, and a mesa including the active region 16 is formed on a portion of the n-type layer 14. The device 10H includes a first p-type layer 18A and a second p-type layer 18B located on the active region 16 and a p-type contact 20J including a plurality of small area contacts and an electrode, each of which can be configured as described herein. However, in this embodiment, the electrode of the p-type contact 20J directly contacts a surface of the second p-type layer 18B.

The device 10J is further shown including an n-type contact 34, which includes a plurality of small area contacts 38 (which can be formed in clusters as described herein) and an electrode 36. As illustrated, the electrode 36 of the n-type contact 34 can be formed in an opening etched through the substrate 12A in order to reach the n-type layer 14. Similar to the electrode 22 described herein, an embodiment of the electrode 36 can be transparent to radiation generated by the active region 16. The small area contacts 38 can extend through the buffer layer 12B and partially penetrate the n-type layer 14. It is understood that the location of the n-type contact 34 is only illustrative. For example, in other embodiments, the n-type contact 34 can be located on the exposed top surface of the n-type layer 14. Alternatively, the n-type contact 34 can be deposited over the substrate 12A, prior to growth of the buffer layer 12B and additional semiconductor layers thereon.

Figure 4C:
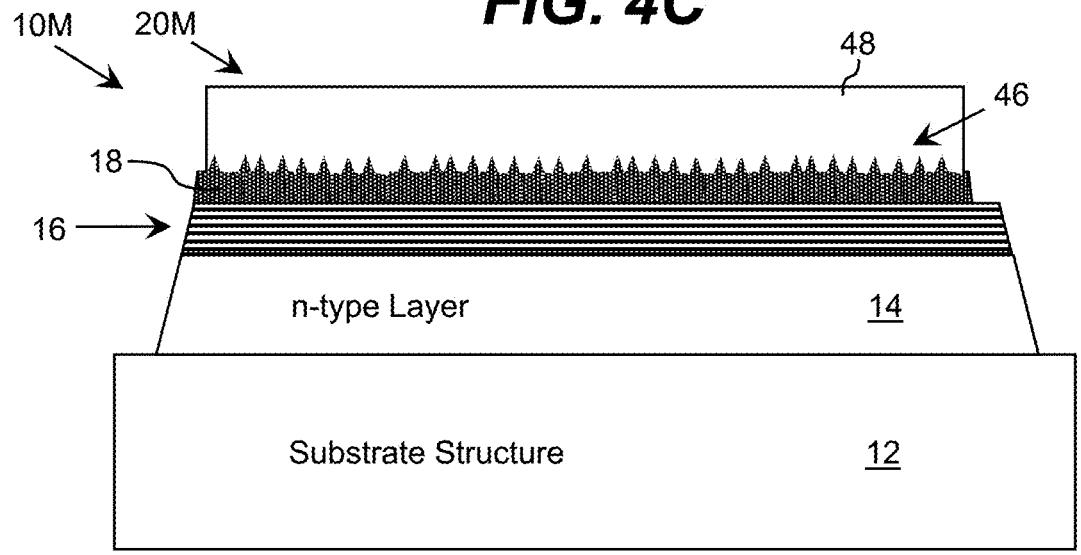

A contact (n- or p-type) including a plurality of small area contacts that penetrate a corresponding semiconductor layer and one or more electrodes electrically connecting the small area contacts can be fabricated using any of various approaches. To this extent, FIGS. 4A-4C show several illustrative schematics of device heterostructures showing different approaches for forming small area contacts according to embodiments. In FIG. 4A, the device 10K includes a p-type contact 20K, which is formed on the surface of a dielectric layer 30 including a plurality of openings. The openings extend through the dielectric layer 30 to the surface of the underlying p-type layer 18. The openings can be formed, for example using electron-beam lithography or the like. A metal layer 40 can be deposited over the dielectric layer 30 such that the metal will penetrate and substantially fill the openings. During annealing, the metal can partially penetrate the semiconductor layer to form an ohmic contact.

In FIG. 4B, the device 10L is shown including a p-type contact 20L formed by growing a plurality of nanowires 42 on a surface of the p-type layer 18 and connecting the nanowires 42 to a common electrode 44. The nanowires 42 can be fabricated from, for example, silicon, metal, carbon nanotubes, and/or the like. The nanowires can form an ohmic contact with the semiconductor layer through epitaxial growth or an annealing process partially penetrating and alloying with the semiconductor material.

FIG. 4C shows an illustrative device 10M in which the p-type contact 20M is formed by treating a top surface of the p-type layer 18 to create a rough surface 46 on which an electrode 48 is deposited. For example, the rough surface 46 can be formed using aggressive etching, such as reactive ion etching. The rough surface 46 can be configured to create openings which are penetrated by the electrode 48, thereby creating the small area contacts.

Figure 5A:
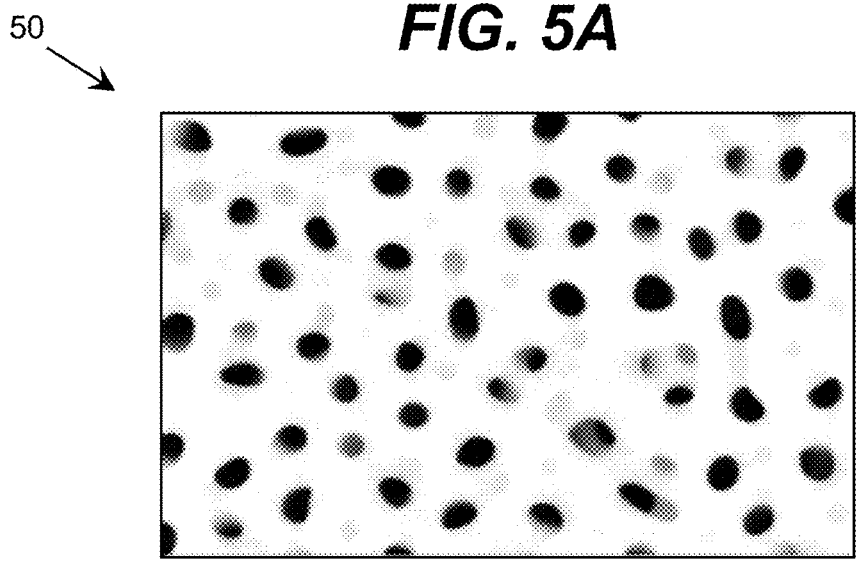
Figure 5B:
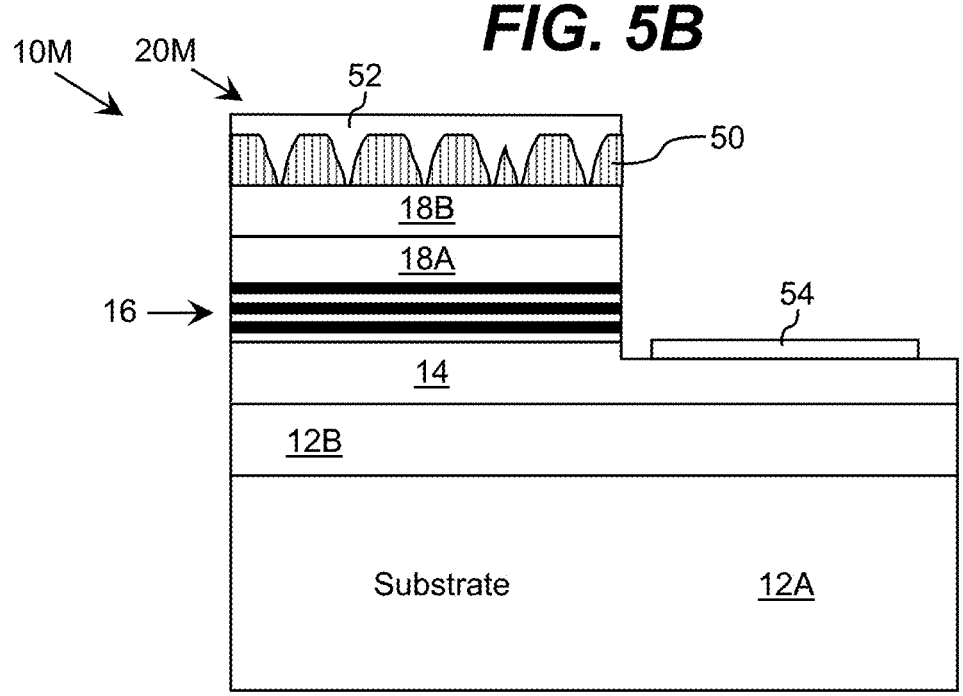
FIGS. 5B and 5C show illustrative schematics of device heterostructures with one or more contacts formed using such a layer according to embodiments.
Figure 5C:
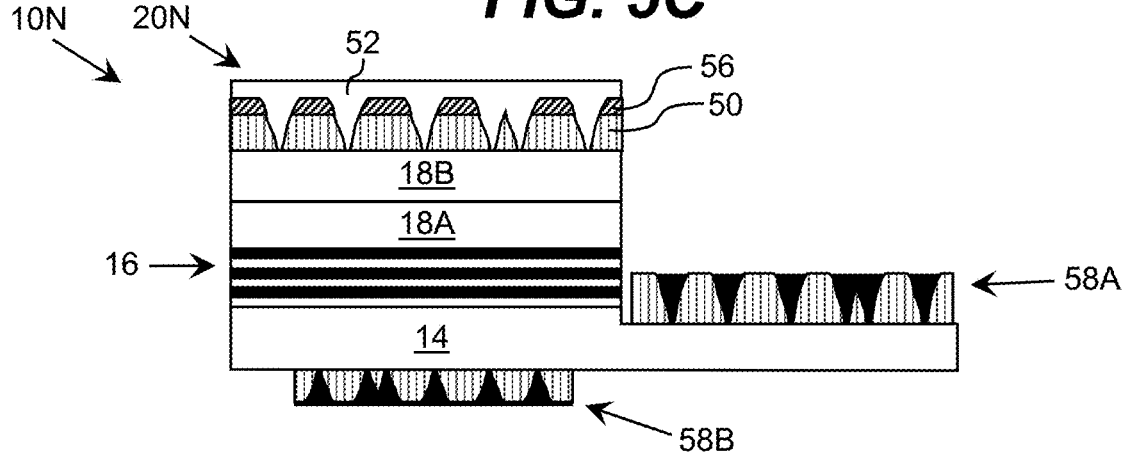

A device described herein can use an anodized aluminum oxide (AAO) layer to form the small area contacts described herein. For example, FIG. 5A shows a microscopic image of a top surface of an AAO layer 50, while FIGS. 5B and 5C show illustrative schematics of device heterostructures with one or more contacts formed using such a layer according to embodiments. As is known in the art, the AAO layer 50 can comprise a structure with multiple self-organized openings having opening diameters ranging from 50 nanometers to 200 nanometers. The openings can be self-aligned at distances commensurate with the opening diameters. As an AAO layer 50 can be fabricated to have clusters of pores having various diameters and spacings, it is understood that an AAO layer 50 can be utilized to fabricate any of the contact structures described herein.

As shown in FIG. 5B, the device 10M includes a p-type contact 20M, which is formed by depositing an AAO layer 50 over a semiconductor layer (e.g., the p-type semiconductor layer 18B). The openings in the AAO layer 50 can have a variable diameter, which can be configured during fabrication of the AAO layer 50. In particular, the openings can comprise funnel like structures with diameters that narrow towards the semiconductor layer 18B. The precise narrowing of the diameters of the openings and the thickness of the AAO layer 50 are controlled by the AAO layer fabrication parameters. For example, for an electro-chemical fabrication process, such parameters include voltage, for example. In an embodiment, the p-type metallic electrode 52 is deposited over the AAO layer 50 such that the p-type metal 52 is capable of contacting the underlying semiconductor layer 18B through the AAO layer openings. In an embodiment, prior to deposition of the p-type metal 52, an exposed surface of the p-type layer 18B can be etched to form valleys below the openings in the AAO layer 50. These valleys can accommodate sharp electrodes protruding from the openings in the AAO layer 50 into the p-type layer 18B. Additionally, the structure can be annealed to provide good ohmic characteristics for the protruding electrodes and the p-type layer 18B.

In the device 10M, an n-type contact 54 can be fabricated using any solution. The n-type contact 54 can form an ohmic contact to the n-type layer 14 and can include, for example, one or more conductive metal layers. As illustrated by the device 10N of FIG. 5C, a device can include one or more n-type contacts 58A, 58B, at least one of which can be fabricated using an AAO layer as described herein. For example, the n-type contact 58A is shown as including an AAO layer with a metal deposited therein, which is formed on an exposed surface of the n-type layer 14 adjacent to a mesa including the active region 16. As illustrated in conjunction with the contact 58A, a contact described herein (including the p-type contacts described herein) can be implemented without a top electrode physically connecting the plurality of small area contacts. Additionally, in an embodiment, the device 10M can be fabricated through a substrate liftoff, and an n-type contact 58B can be added to a bottom surface of the semiconductor layer 14, which can be fabricated using any solution, such as an AAO layer as shown in FIG. 5C.

Additionally, the device 10N includes a p-type contact 20N that includes a reflective layer 56 deposited over regions of the AAO layer 50 that do not contain openings (between the pores of the AAO layer). Inclusion of the reflective layer 56 can be beneficial for photon recycling and/or further increase light extraction from the semiconductor device 10N. While shown in conjunction with the AAO layer 50, it is understood that other contacts described herein can include a similarly configured reflective layer 56.

A contact (n- or p-type) including a plurality of small area contacts that penetrate a corresponding semiconductor layer and one or more electrodes electrically connecting the small area contacts can provide an improved carrier injection into the active region 16. For example, when the contact is a p-type contact to a group III nitride semiconductor layer 18, the p-type contact can provide an improved hole injection into the active region 16 due to high ionization energy of the acceptor doped group III nitride material.

The following discusses the inventors' current understanding of the theoretical basis for the contacts described herein. However, it is understood that the invention is not limited to any particular theory of operation and/or particular benefits described herein.

Figure 6:
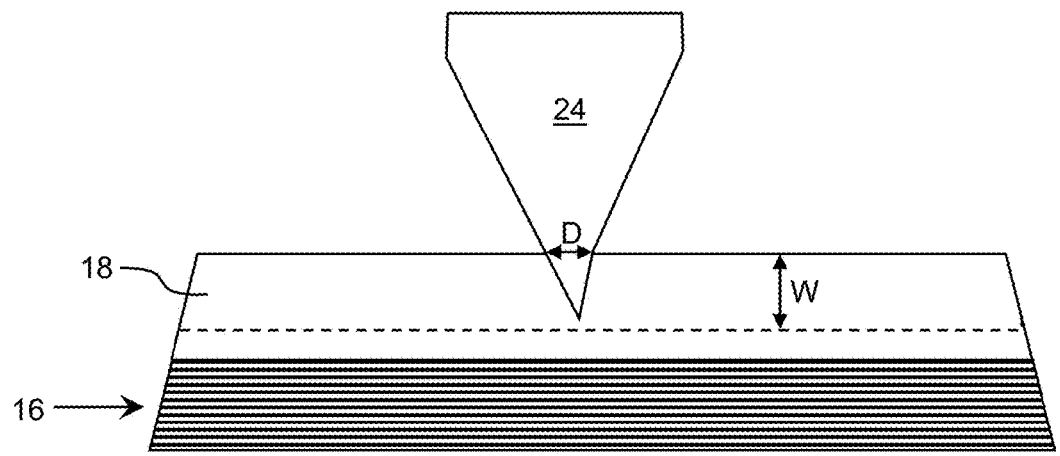
FIG. 6 shows a magnified view of an interface between a small area contact and a p-type layer according to an embodiment.

FIG. 6 shows a magnified view of an interface between a small area contact 24 and a p-type layer 18 according to an embodiment. Further discussion of aspects of the invention are described in which the p-type layer 18 is a p-type doped AlGaN layer and the small area contact 24 is a metal, which can comprise nickel, for example.

As shown in FIG. 6, a small area contact 24 have a lateral size D at an interface between the small area contact and the p-type layer 18. As used herein, the lateral size refers to the largest lateral measurement (e.g., the diameter) of the small area contact 24 as measured at the surface of the p-type layer 18 the small area contact 24. The lateral size of the portion of the small area contact 24 that penetrates below the surface of the p-type layer 18 can be smaller or equal to the lateral size at the surface of the p-type layer 18, while the lateral size of the small area contact 24 located outside of the p-type layer 18 can be larger. As used herein, a characteristic lateral size of a plurality of small area contacts 24 corresponds to the average lateral size of the plurality of small area contacts 24 as measured at the surface of the p-type layer 18. Similarly, a characteristic lateral separation of a plurality of small area contacts 24 corresponds to the average lateral separation between adjacent edges of the plurality of small area contacts 24 as measured at the surface of the p-type layer 18.

Additionally, a small area contact 24 has a depletion region width W, which corresponds to a depletion region formed at the interface between the small area contact 24 and the p-type layer 18. The depletion region width W can be calculated using the expression $W=\sqrt{2\epsilon\epsilon_0 V_{bi}/(qN_a)}$, where $\epsilon$ is the relative dielectric permittivity of the semiconductor material of the p-type layer 18 ($\epsilon \approx 9$ for AlGaN), q is the elementary charge, and $\epsilon_0$ is the dielectric permittivity of vacuum. $V_{bi}$ is a built-in potential barrier, which can be calculated as: $V_{bi}=\phi_m-X-\phi_n$, where $\phi_m$ is the metal work function known for different metals, X is the electron affinity for a semiconductor, and $\phi_n$ is the difference between conductive band energy and fermi level energy, which can be calculated for typical non-degenerate doping values as $\phi_n=kT/q\ln(N_v/N_a)$. $N_a$ is the acceptor doping level and $N_v$ is the effective density of states known for the material. As used herein, a characteristic depletion region width of a plurality of small area contacts 24 corresponds to the average depletion region width W of the plurality of small area contacts 24.

Figure 7A:
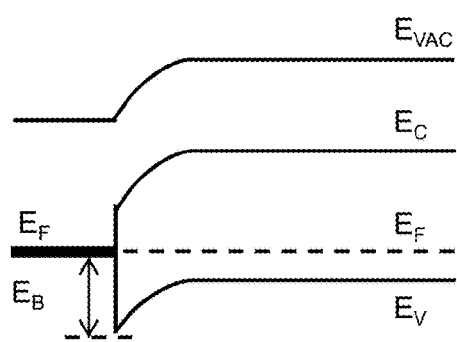
FIGS. 7A and 7B show band diagrams of a conventional metal p-semiconductor contact and a metal-semiconductor contact with a reduced barrier height according to an embodiment, respectively.
Figure 7B:
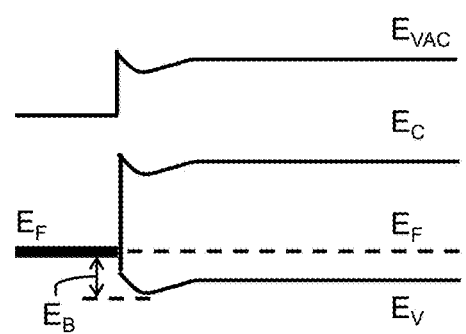

FIGS. 7A and 7B show band diagrams of a conventional metal p-AlGaN semiconductor interface and a metal p-AlGaN semiconductor interface with a reduced barrier height according to an embodiment, respectively. As illustrated in FIG. 7A, a highest metal work function typically does not exceed 5.2 eV. The ionization energy, i.e., the energy required to excite an electron from the ceiling of the valence energy band, $E_V$, into vacuum (e.g., to the vacuum energy level $E_{VAC}$), in AlGaN materials has been found to be around 6 to 6.2 eV and nearly independent of the Al composition. A difference, $E_B$, between the metal work function and semiconductor ionization energy results in a barrier at the metal-semiconductor interface. Surface treatment, such as, for example, reactive ion etching, can provide a reduction in the ionization energy at the surface by around 0.5 eV. However, the ionization energy still exceeds the metal work function by around 0.5 eV. Therefore, for a metal-p-AlGaN contact, the potential barrier height $E_B$ is typically at least 0.5 to 1 V. This high barrier presents one of the most significant challenges in obtaining a low-resistance contact to p-AlGaN material.

According to an embodiment of the invention, the barrier height can be decreased by utilizing an effect of barrier lowering in the presence of a strong electric field across the metal-semiconductor interface. An amount of the effective barrier height decrease due to the electric field, $\Delta\phi$, is given by the following expression:

$$\Delta\phi = \sqrt{\left(\frac{qE}{4\pi\varepsilon\varepsilon_0}\right)} \quad (1)$$

where $\Delta\phi$ is the barrier height in volts, $\varepsilon$ is relative dielectric permittivity of the semiconductor material ($\varepsilon \approx 9$ for AlGaN), q is the elementary charge, $\varepsilon_0$ is the dielectric permittivity of vacuum, and E is the electric field at the interface. The electric field required to fully compensate a barrier height of 0.5 to 1 V can then be found as:

$$E = \frac{4\pi\varepsilon\varepsilon_0\Delta\phi^2}{q} \quad (2)$$

Substituting typical numbers from the above discussion, the required values of the electric field, $E \approx 15\text{-}62.5$ MV/cm. These high values of interface electric field are hardly reachable as they are close to or exceed the material breakdown field.

However, the inventors have found that significant improvement of hole injection through the barrier can still be achieved using a high electric field at small area electrodes. The metal-semiconductor junction forms a capacitor in which the depletion region acts as a dielectric separating the charged plates. When the electrode size becomes equal to or smaller than the depletion region width, d, the charge density and the corresponding electric field increase significantly due to edge effects. As shown in the prior art, the charge density can be calculated as a function of a position along an electrode for different values of the electrode form factor, which is the plate size divided by the plate separation. In an embodiment, the plate separation corresponds to the depletion region width W (FIG. 6), whereas the plate size corresponds to the contact size or diameter D (FIG. 6). Therefore, the electrode form factor can be calculated as W/D.

Typical depletion region width of a metal-AlGaN junction ranges from 0.05-0.1 μm. Assuming a contact size or diameter D equal to or smaller than W, D≤W, prior art calculations indicate that the charge density in such a small area contact increases by a factor 10-15 as compared to a large area electrode, where D>W. According to Gauss' law, the electric field is proportional to charge density. Therefore, for a small area electrode forming a contact to a p-AlGaN material, the electric field across the depletion region increases by a factor of 10-15 when D≤W as compared to when D>W.

For large area (conventional) electrodes, the electric field across the metal-AlGaN interface can be found as $E_0 = \Delta\phi/W$. Assuming $\Delta\phi=1$ V and W=0.05 μm, $E_0 \approx 0.2$ MV/cm. Therefore, in the small-area electrode the electric field across the junction could be as high as $E_F=2\text{-}3$ MV/cm. Substituting these into the expression (1), an achievable barrier height reduction is obtained. For $E_F=2$ MV/cm, $\Delta\phi=0.179$ V, while for $E_F=3$ MV/cm, $\Delta\phi=0.219$ V.

The corresponding relative increase of the injected hole concentration R can be found as:

$$R \approx \exp\left(\frac{q\Delta\phi}{kT}\right) \quad (3)$$

For the above-stated range of achievable electric field in the small-area contacts, R=970-4500. A condition for achieving the above R-values is:

$$D \leq W \quad (4)$$

Assuming that typically W=0.05-0.1 μm, the electrode size or diameter according can be typically:

$$D \leq 0.1 \text{ μm} \quad (5)$$

Therefore, embodiments of the invention can improve the hole injection into the SSLS p-type region by at least three orders of magnitude. When the electrode size or diameter D at the interface with the p-type layer 18 (e.g., AlGaN) meets the conditions (4, 5). To eliminate interaction between the edge fields of a plurality of small area electrodes 24, the electrode separation can be at least equal to the space-charge width W. To this extent, embodiments of the small area electrodes 24 described herein can have a lateral size (e.g., diameter) configured to meet the conditions (4, 5) and a lateral spacing larger than the space-charge width W. To this extent, one or more features utilized to form the small area electrodes also can be configured to meet the conditions (4, 5). For example, the openings in the dielectric layer 30 shown in FIG. 4A, the treatment conditions to create the surface roughness 46 shown in FIG. 4B, the AAO layer 50 shown in FIGS. 5A-5C, each can form small area electrodes 24 having a characteristic size (e.g., an average diameter) that meets the conditions (4, 5).

While certain features may be shown and described in conjunction with only one or some of the heterostructure and/or device configurations included herein for clarity, it is understood that a heterostructure and/or device described herein can include any combination of the various features described herein. To this extent, the various drawings do not show mutually exclusive features which cannot be combined to form heterostructures or devices not explicitly shown in the drawings.

While illustrative aspects of the invention have been shown and described herein primarily in conjunction with a heterostructure for a solid state light source and a method of fabricating such a heterostructure and/or device, it is understood that aspects of the invention further provide various alternative embodiments.

For example, an embodiment of the invention provides a circuit including one or more of the SSLSs described herein. The circuit can operate the SSLS(s) to emit diffuse or laser light, evaluate a physical matter, and/or the like. An embodiment of a circuit includes an array containing multiple SSLSs, which can be operated collectively, individually, and/or in subsets.

Figure 8:
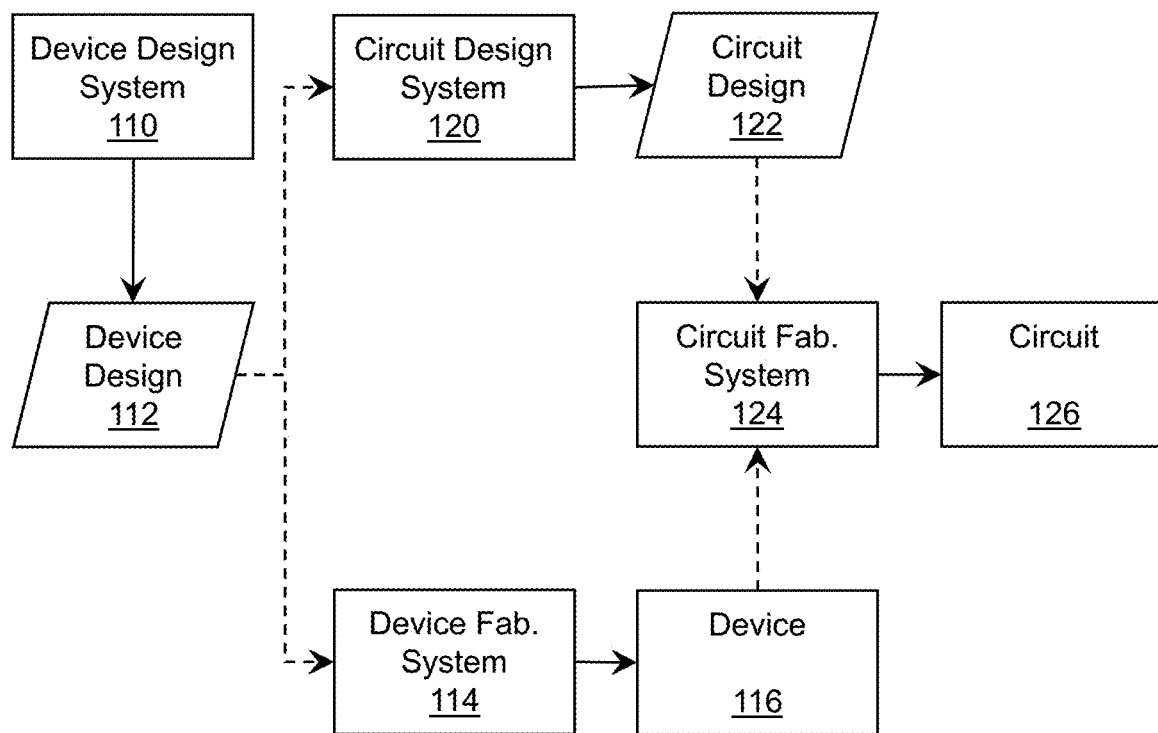
FIG. 8 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 8 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A solid state light source comprising:
an active region;
a contact for injecting holes into the active region; and
a p-type layer located between the active region and the contact, wherein the contact includes:
a plurality of small area contacts extending only partially through the p-type layer; and
a set of electrodes physically connecting the plurality of small area contacts,
wherein the plurality of small area contacts have a characteristic lateral size at an interface between the small area contact and the p-type layer equal to or smaller than a characteristic depletion region width located at the interface between the plurality of small area contacts and the p-type layer.

2. The solid state light source of claim 1, wherein the characteristic lateral size is less than 0.1 microns.

3. The solid state light source of claim 1, wherein the plurality of small area contacts have a characteristic lateral separation at the interface of at least the depletion region width.

4. The solid state light source of claim 1, wherein the plurality of small area contacts form a plurality of clusters, wherein each cluster includes a distinct subset of the plurality of small area contacts and has a corresponding cluster-specific characteristic lateral separation, and wherein each cluster is laterally separated from another cluster at the interface by a distance that is greater than the cluster-specific characteristic lateral separations of each cluster.

5. The solid state light source of claim 4, wherein the set of electrodes includes a plurality of physically separate electrodes, and wherein the plurality of small area contacts for each cluster are physically connected to only one of the plurality of physically separate electrodes.

6. The solid state light source of claim 1, wherein the plurality of small area contacts are formed by nanowires.

7. The solid state light source of claim 1, further comprising a dielectric layer located between the set of electrodes and the p-type layer, wherein the plurality of small area contacts extend completely through the dielectric layer.

8. The solid state light source of claim 1, further comprising a second p-type layer located between the p-type layer and the active region, wherein the second p-type layer has a bandgap larger than a bandgap of the p-type layer.

9. The solid state light source of claim 1, further comprising an anodized aluminum oxide layer located between the set of electrodes and the p-type layer, wherein the plurality of small area contacts extend completely through the anodized aluminum oxide layer.

10. The solid state light source of claim 1, further comprising a reflective layer located between the set of electrodes and the p-type layer, wherein the plurality of small area contacts extend completely through the reflective layer.

11. A solid state light source comprising:
an active region;
a contact;
a semiconductor layer located between the active region and the contact, wherein the contact includes a plurality of small area contacts extending only partially through the semiconductor layer, wherein the plurality of small area contacts have a characteristic lateral size at an interface between the small area contact and the semiconductor layer equal to or smaller than a characteristic depletion region width located at the interface between the plurality of small area contacts and the semiconductor layer, wherein the plurality of small area contacts form a plurality of clusters, and wherein the characteristic lateral size is less than 0.1 microns; and
a trench extending completely through at least the semiconductor layer in a spacing between at least two of the plurality of clusters.

12. The solid state light source of claim 11, further comprising at least one electrode physically connecting the plurality of small area contacts.

13. The solid state light source of claim 11, wherein the semiconductor layer is a p-type layer and the contact is configured to inject holes into the active region.

14. The solid state light source of claim 11, wherein the semiconductor layer is an n-type layer and the contact is configured to inject electrons into the active region.

15. The solid state light source of claim 14, wherein the contact is located between a substrate and the semiconductor layer.

16. The solid state light source of claim 11, wherein the plurality of small area contacts form a plurality of clusters, the solid state light source further including an insulating layer on the semiconductor layer in a spacing between at least two of the plurality of clusters.

17. A solid state light source comprising:
a light emitting multiple quantum well active region having a p-type side and an n-type side;
a p-type contact; and
a p-type semiconductor layer located between the active region and the contact on the p-type side, wherein the p-type contact includes:
a plurality of small area contacts extending only partially through the semiconductor layer, wherein the plurality of small area contacts have a characteristic lateral size at an interface between the small area contact and the semiconductor layer equal to or smaller than a characteristic depletion region width located at the interface between the plurality of small area contacts and the semiconductor layer, and wherein the characteristic lateral size is less than 0.1 microns; and
a set of electrodes physically connecting the plurality of small area contacts.

18. The solid state light source of claim 17, wherein the set of electrodes includes two physically separate electrodes, each of the two physically separate electrodes physically connecting a unique subset of the plurality of small area contacts.

19. The solid state light source of claim 18, further comprising means for holding a test substance in a spacing between the two physically separate electrodes.

20. The solid state light source of claim 18, wherein the means for holding the test substance in the spacing includes encapsulating the test substance.

* * * * *